United States Patent
Vidhi et al.

(10) Patent No.: US 11,762,030 B2
(45) Date of Patent: Sep. 19, 2023

(54) SELECTIVE REDISTRIBUTION AND REPLENISHMENT OF UTILITY SCALE BATTERY ELECTRIC STORAGE SYSTEMS

(71) Applicant: Inventus Holdings, LLC, Juno Beach, FL (US)

(72) Inventors: Rachana Vidhi, Palm Beach Gardens, FL (US); Ryan K. McMorrow, Jupiter, FL (US); Carlos H. N. Alves, Royal Palm Beach, FL (US); Matthew T. Smith, North Palm Beach, FL (US)

(73) Assignee: INVENTUS HOLDINGS, LLC, Juno Beach, FL (US)

( * ) Notice: Subject to any disclaimer, the term of this patent is extended or adjusted under 35 U.S.C. 154(b) by 187 days.

(21) Appl. No.: 16/813,990

(22) Filed: Mar. 10, 2020

(65) Prior Publication Data
US 2020/0209322 A1 Jul. 2, 2020

Related U.S. Application Data

(62) Division of application No. 15/695,739, filed on Sep. 5, 2017, now Pat. No. 10,634,730.
(Continued)

(51) Int. Cl.
*G01R 31/392* (2019.01)
*G01R 31/42* (2006.01)
(Continued)

(52) U.S. Cl.
CPC ..... *G01R 31/392* (2019.01); *G01R 31/31907* (2013.01); *G01R 31/367* (2019.01);
(Continued)

(58) Field of Classification Search
CPC ............ G01R 31/392; G01R 31/31907; G01R 31/367; G01R 31/3842; G01R 31/389;
(Continued)

(56) References Cited

U.S. PATENT DOCUMENTS 6,356,058 B1 3/2002 Maio et al.
7,579,842 B2 8/2009 Hunter et al.
(Continued)

OTHER PUBLICATIONS

Roberson, Dakota, et al. "Performance assessment of the PNM prosperity electricity storage project." A Study for the DOE Energy Storage Systems Program, Sandia National Laboratories, Livermore, Calif, USA (2014). (Year: 2014).*
(Continued)

*Primary Examiner* — Daniel Cavallari
(74) *Attorney, Agent, or Firm* — TAROLLI, SUNDHEIM, COVELL & TUMMINO, LLP

(57) ABSTRACT

One example includes a battery power system that includes a plurality of battery containers. Each of the battery containers can include a plurality of battery modules that provide output power to a point-of-interconnect associated with a power grid. Each of a portion of the plurality of battery containers includes a plurality of original battery modules and at least one of a plurality of redistributed battery modules from a redistributed battery container. The redistributed battery container includes battery modules of a substantially similar state-of-health to the plurality of original battery modules of each of the portion of the plurality of battery containers. The redistributed battery container includes a plurality of newer battery modules with a substantially similar state-of-health that is greater than the state-of-health of the plurality of original battery modules and which were subsequently installed after redistribution of the plurality of redistributed battery modules.

6 Claims, 4 Drawing Sheets

Related U.S. Application Data

(60) Provisional application No. 62/385,425, filed on Sep. 9, 2016.

(51) Int. Cl.
| | |
|---|---|
| *G01R 31/319* | (2006.01) |
| *G01R 31/367* | (2019.01) |
| *G01R 31/389* | (2019.01) |
| *G01R 31/3842* | (2019.01) |
| *H01M 10/48* | (2006.01) |
| *H01M 10/44* | (2006.01) |
| *G01R 31/382* | (2019.01) |

(52) U.S. Cl.
CPC ....... *G01R 31/389* (2019.01); *G01R 31/3842* (2019.01); *G01R 31/42* (2013.01); *H01M 10/441* (2013.01); *H01M 10/482* (2013.01); *G01R 31/382* (2019.01)

(58) Field of Classification Search
CPC ... G01R 31/42; G01R 31/382; H01M 10/441; H01M 10/482; Y02E 60/10
See application file for complete search history.

(56) References Cited

U.S. PATENT DOCUMENTS

| | | |
|---|---|---|
| 2009/0006010 A1 | 1/2009 | Van Sloun et al. |
| 2014/0320144 A1* | 10/2014 | Nakaya ............ G06Q 10/06315 |
| | | 324/434 |
| 2017/0093156 A1 | 3/2017 | Ozbek et al. |

OTHER PUBLICATIONS

Wikipedia contributors. "State of health." Wikipedia, The Free Encyclopedia. Wikipedia, The Free Encyclopedia, Jul. 19, 2019. Web Nov. 26, 2019. (Year: 2020).

* cited by examiner

250 ⟶

┌─ 252
MONITORING AN ENERGY CAPACITY ASSOCIATED WITH EACH OF A PLURALITY OF BATTERY CONTAINERS, EACH OF THE PLURALITY OF BATTERY CONTAINERS COMPRISING A PLURALITY OF BATTERY RACKS CONFIGURED TO PROVIDE AN OUTPUT POWER TO A POINT-OF-INTERCONNECT ASSOCIATED WITH A POWER GRID

┌─ 254
COMPARING THE ENERGY CAPACITY ASSOCIATED WITH EACH OF THE PLURALITY OF BATTERY CONTAINERS TO A PREDETERMINED ENERGY CAPACITY THRESHOLD TO MONITOR A BATTERY DEGRADATION OF EACH OF THE PLURALITY OF BATTERY CONTAINERS

┌─ 256
SELECTING A MAINTENANCE SOLUTION COMPRISING AT LEAST ONE OPTION FROM A LIST COMPRISING A REPLACEMENT SOLUTION, A REPLENISHMENT SOLUTION, AND A REDISTRIBUTION SOLUTION IN RESPONSE TO DETERMINING THAT THE ENERGY CAPACITY IS LESS THAN THE PREDETERMINED ENERGY CAPACITY THRESHOLD

┌─ 258
PROVIDING SOLUTION INSTRUCTIONS FOR IMPLEMENTING THE DETERMINED MAINTENANCE SOLUTION

FIG. 6

SELECTIVE REDISTRIBUTION AND REPLENISHMENT OF UTILITY SCALE BATTERY ELECTRIC STORAGE SYSTEMS

RELATED APPLICATION

This application is a divisional of U.S. Non-provisional patent application Ser. No. 15/695,739, filed 5 Sep. 2017, which claims the benefit of priority of U.S. Provisional Patent Application Ser. No. 62/385,425, filed 9 Sep. 2016, each of which applications is incorporated herein by reference in its entirety.

TECHNICAL FIELD

This disclosure relates generally to a power maintenance system, and more specifically to selective redistribution and replenishment of utility scale battery electric storage systems.

BACKGROUND

Battery storage technology is becoming integrated into a power grid in a public utility or industrial power environment. A battery site may include a multiplicity of battery containers for storing and supplying electricity from and to the respective power grid. The power storage capacity of the batteries in a battery container degrade as the battery power system is used, and the capacity of the batteries can degrade to such a point that the battery container can no longer provide the same amount of energy as initially provided at installation. Degraded batteries can be disposed of, such as to replace the batteries with new batteries, but such disposing of degraded capacity batteries may be wasteful because the batteries may still have some useful battery capacity. Additionally, new batteries may have a lower impedance than the existing batteries in the battery power system, and thus may provide a disproportionate amount of power relative to the existing batteries of the battery container.

SUMMARY

One example includes a battery power system that includes a plurality of battery containers. Each of the battery containers can include a plurality of battery modules that provide output power to a point-of-interconnect associated with a power grid. Each of a portion of the plurality of battery containers includes a plurality of original battery modules and at least one of a plurality of redistributed battery modules from a redistributed battery container. The redistributed battery container includes battery modules of a substantially similar state-of-health to the plurality of original battery modules of each of the portion of the plurality of battery containers. The redistributed battery container includes a plurality of newer battery modules with a substantially similar state-of-health that is greater than the state-of-health of the plurality of original battery modules and which were subsequently installed after redistribution of the plurality of redistributed battery modules.

Another example includes a method for maintaining a battery power system. The method includes monitoring an energy capacity associated with each of a plurality of battery containers. Each of the plurality of battery containers includes a plurality of battery modules configured to provide an output power to a point-of-interconnect associated with a power grid. The energy capacity can be monitored based on an impedance associated with a respective plurality of battery modules. The method also includes comparing the energy capacity associated with each of the plurality of battery containers to a predetermined energy capacity threshold to monitor a battery degradation of each of the plurality of battery containers. The method also includes selecting a maintenance solution comprising at least one option from a list comprising a replacement solution and a redistribution solution in response to determining that the energy capacity is less than the predetermined energy capacity threshold. The method further includes providing solution instructions for implementing the selected maintenance solution.

Another example includes a method for maintaining a battery power system comprising a plurality of battery containers. Each of the battery containers includes a plurality of battery modules of a substantially similar state-of-health that provide an output power to a point-of-interconnect associated with a power grid. The method includes redistributing the plurality of battery modules associated with a given one of a plurality of battery containers to a respective remaining plurality of battery containers.

BRIEF DESCRIPTION OF THE DRAWINGS

FIG. 6 illustrates a method for maintaining a battery power system.

DETAILED DESCRIPTION

This disclosure relates generally to power maintenance system, and more specifically to selective redistribution and replenishment of utility scale battery electric storage systems. A battery power system includes a plurality of battery containers, with each of the battery containers including a plurality of battery modules. Each of the battery modules can provide an output power to a point-of-interconnect (POI) associated with a power grid. The battery power system also includes a degradation monitoring system that is configured to monitor a state-of-health (e.g., an energy capacity) associated with the respective plurality of battery modules. As an example, the energy capacity can be directly proportional to a measure of impedance of the battery modules, and thus the total degradation of the battery modules in the respective battery container. For example, each of the battery modules can include one or more batteries that are arranged to provide an aggregate power to the POI associated with the power grid.

The battery power system also includes a degradation controller that is configured to monitor the battery degradation associated with each of the battery containers. As an example, the degradation controller can monitor the energy capacity associated with the each of the battery modules associated with the respective battery containers to determine the battery degradation of each of the battery containers. In response to the measured battery degradation, such as in response to determining an energy capacity being less than a predetermined energy capacity threshold, the degradation controller can determine a maintenance solution for installation of new battery modules.

As a first example, the maintenance solution can be a replacement solution that includes replacing all of the battery modules in a given one of the battery containers and disposing of the previous battery modules of the given one of the battery containers. As a second example, the maintenance solution can be a replenishment solution that includes adding a battery module to one or more of the battery containers to increase the energy capacity of the respective battery container(s). As a third example, the maintenance solution can be a redistribution solution that includes redistributing the battery modules of a given one of the battery containers to be added to one or more of the remaining battery containers, and replacing the battery modules in the given one of the battery containers. As a result, the degradation controller can effectively maintain the power requirements of the battery power system in a manner that minimizes waste and is most efficient based on the monitored energy capacity.

Figure 1:
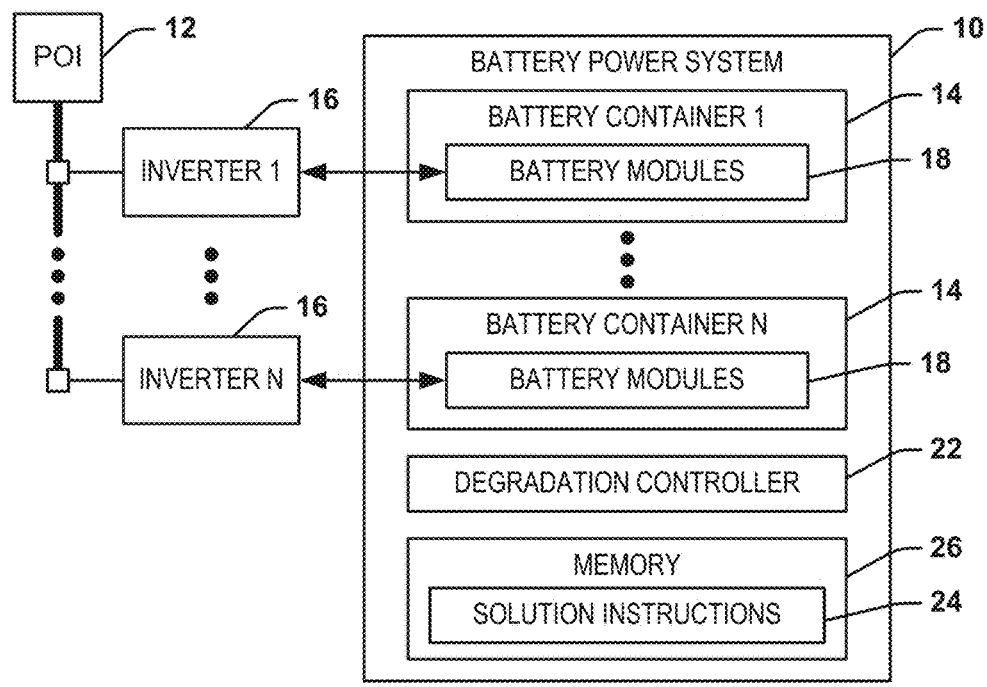
FIG. 1 illustrates an example of a battery power system.

FIG. 1 illustrates an example of a battery power system 10. The battery power system 10 can be implemented in any of a variety of power applications, such as to provide power to a public power grid, industrial power grid, or other type of power system via a point-of-interconnect (POI) 12.

The battery system 10 includes a plurality of battery containers 14. Each of the battery containers 14 can be configured to provide a respective contribution of power to the POI 12 via a respective inverter 16. Each of the inverters 16 is configured to convert the DC power of the respective battery container 14 to AC power at the POI 12 for power consumption, and is configured to convert the AC power at the POI 12 to DC power of the respective battery container 14 for power storage. In the example of FIG. 1, the battery containers 14 each include a plurality of battery modules 18, wherein each of the battery modules 18 is configured as including one or more batteries (e.g., coupled in series). As an example, the battery modules 18 can each be configured as any of a variety of arrangements of batteries, such as battery racks that are secured to battery containers 14. Therefore, the battery modules 18 of each of the battery containers 14 can be arranged (e.g., in parallel) to provide an aggregate output power to POI 12 via the respective inverters 16. As an example, each of the battery containers 14 can correspond to a cabinet or other structure configured to at least partially enclose the respective battery modules 18, such as to facilitate relative ease in installation and removal of the respective battery modules 18 for purposes of implementing a maintenance solution, as described in greater detail herein.

Additionally, in the example of FIG. 1, the battery power system 10 includes a degradation controller 22 that is configured to monitor a state-of-health or energy capacity of the respective battery modules 18, and thus the battery container 14. The state-of-health or energy capacity can be directly proportional to a measure of total degradation of the battery modules 18 in each of the respective battery containers 14. Therefore, based on the measurement of the energy capacity of each of the battery containers 14, the degradation controller 22 can effectively determine a degradation of the battery modules 18. As an example, the degradation of a given battery container 14, and thus the aggregate degradation of the battery modules 18 therein, can be determined as a present condition, over time, and relative to a predetermined initial energy capacity or baseline, and/or can be determined in a predictive manner to determine an approximate degradation at a future time. As an example, the monitoring of the energy capacity of the respective battery containers 14 can be implemented as described in co-pending Application entitled "Step Time Battery Degradation Determination", assigned U.S. patent application Ser. No. 15/095,693, which is incorporated herein by reference in its entirety.

In addition, the degradation controller 22 can be configured to compare the respective indication of energy capacity of each of the battery containers 14, such as based on impedance, to determine the relative degradation of the battery module(s) 18 in each of the respective battery containers 14. Thus, in response to the comparative energy capacity of the battery module(s) 18 in the battery containers 14, the degradation controller 22 can be configured to determine a maintenance solution for one or more of the battery containers 18 in response to the monitored energy capacity of the respective battery containers 14 indicating sufficient degradation of the battery module(s) 18 to warrant maintenance. While the degradation controller 22 is demonstrated in the example of FIG. 1 as a single unit that provides degradation monitoring of each of the battery containers 14, it is to be understood that, alternatively, the battery containers 14 can each include a respective energy capacity monitor that communicates an indication of degradation of the respective battery modules 18 with the degradation controller 22, such that the degradation controller 22 can compare the energy capacity of each of the battery modules based on the indication of degradation provided by the respective energy capacity monitor(s).

For example, the degradation controller 22 can compare the energy capacity of each of the battery containers 14 with a predetermined energy capacity threshold. As an example, the predetermined energy capacity threshold can be indicative of an acceptable energy capacity associated with a given one of the battery containers 14 in providing sufficient output power to the power grid via the respective inverter 16 and the POI 12. As another example, the predetermined energy capacity threshold can vary between the battery containers 14, and can be programmable to meet the specific power requirements of the power grid. As yet another example, the predetermined energy capacity threshold can be associated with a predictive degradation of the battery containers 14, such that the predetermined energy capacity threshold can be indicative of a future shortfall in energy capacity of the respective battery unit(s) 14. As a result, the maintenance solution can be provided as a preventative maintenance solution to accommodate such a future shortfall in energy capacity of the respective battery unit(s) 14. Furthermore, the predetermined energy capacity threshold is not limited to a single threshold, but can include multiple thresholds that can be indicative of various states of degradation of the battery modules 18 of the respective battery container 14. In response to the monitored energy capacity of a given one or more of the battery containers 14 being less than the predetermined energy capacity threshold, the degradation controller 22 can determine the appropriate maintenance solution for installation of new battery modules 18 in one or more of the battery containers 14.

As a first example, the maintenance solution can be a replacement solution. For example, the replacement solution can be determined to be the appropriate maintenance solution by the degradation controller 22 in response to a determination that the energy capacity associated with a given one of the battery containers 14 is below the predetermined energy capacity threshold and that the energy capacity associated with the remaining battery containers 14 is above the predetermined energy capacity threshold of the respective remaining battery containers 14. As a result, the degradation controller 22 can generate solution instructions 24 that are stored in a memory 26, or can access the predefined solution instructions 24 from the memory 26, in response to the determination of the replacement solution. In the example of the replacement solution, the solution instructions 24 can provide instructions for replacing all of the battery modules 18 in the given one of the battery containers 14, and disposing of the previous (e.g., degraded) battery modules 18 of the given one of the battery containers 14. As an example, the replacement solution can be determined in response to determining that the energy capacity is significantly less than the predetermined energy capacity threshold, and is thus indicative of a degree of degradation of the battery modules 18 that warrants disposal of the previous battery modules 18, as opposed to re-implementing the degraded battery modules 18 as described in greater detail herein.

As a second example, the maintenance solution can be a replenishment solution. For example, the replenishment solution can be determined to be the appropriate maintenance solution by the degradation controller 22 in response to a determination that the energy capacity associated with at least one of the battery containers 14 is below the respective predetermined energy capacity threshold of each of the at least one battery containers 14. As a result, the degradation controller 22 can the generate solution instructions 24 that are stored in the memory 26, or can access the predefined solution instructions 24 from the memory 26, in response to the determination of the replenishment solution. In the example of the replenishment solution, the solution instructions 24 can provide instructions for adding a new battery module 18 to each of one or more of the battery containers 14 (e.g., the battery containers 14 having the energy capacity less than the predetermined energy capacity threshold) to increase the energy capacity of the respective battery container(s) 14. Therefore, the replenishment solution can maintain operation of degraded battery modules 18 that may still have usable power-providing capability, and can thus be more efficient than disposing of degraded battery modules 18.

As a third example, the maintenance solution can be a redistribution solution. For example, the redistribution solution can be determined to be the appropriate maintenance solution by the degradation controller 22 in response to a determination that the energy capacity associated with a given one of the battery containers 14 is above the predetermined energy capacity threshold and the energy capacity associated with one or more of the remaining battery containers 14 is below the predetermined energy capacity threshold. As a result, the degradation controller 22 can the generate solution instructions 24 that are stored in the memory 26, or can access the predefined solution instructions 24 from the memory 26, in response to the determination of the redistribution solution.

In the example of the redistribution solution, the solution instructions 24 can provide instructions for redistributing each of one or more of the battery modules 18 associated with the given one of the battery containers 14 that is greater than the predetermined energy capacity threshold to the remaining one or more of the battery containers 14 that is less than the predetermined energy capacity threshold. The solution instructions 24 for the redistribution solution can also include adding the new battery modules 18 to the given one of the battery containers 14, and thus replacing the redistributed battery modules 18. Therefore, the redistribution solution can likewise maintain operation of degraded battery modules 18 that may still have usable power-providing capability, and can thus be more efficient than disposing of degraded battery modules 18. As an example, the redistribution solution 24 can indicate to which of the battery containers 14 the battery modules 18 are to be redistributed, which can be less than all of the battery modules 18 of the given one of the battery containers 14, and thus less than all of the remaining battery modules 14.

For example, the battery modules 18 of the given one of the battery containers 14 can have degraded at approximately the same rate as the battery modules 18 of the remaining one or more of the battery containers 14, and can thus have an impedance that is approximately equal to the impedance of each of the battery modules 18 in the remaining one or more of the battery containers 14. As a result, in response to implementing the redistribution solution, the redistributed battery modules 18 can have an impedance that is approximately equal to the impedance of the battery modules 18 in the remaining battery container(s) 14. Therefore, the newly distributed battery module 18 can provide additional energy capacity of the respective battery container 14 without providing a significant impedance mismatch with respect to the battery modules 18 therein. Accordingly, the lack of an impedance mismatch that results from the redistribution solution can provide for a more uniform degradation of the battery modules 18, and can mitigate overcurrent conditions with respect to the battery modules 18 and respective wiring.

As another example, the solution instructions 24 can include a combination of the previously defined replacement, replenishment, and redistribution solutions. For example, the solution instructions 24 can include a solution that is a combination of the replenishment and redistribution solutions, such as based on the remaining degraded battery containers 14 numbering greater in quantity than the battery modules 18 in the given one of the battery containers 14 having sufficient energy capacity. As a result, the solution instructions 24 can include redistributing all of the battery modules 18 of the given one of the battery containers 14 to a set of the remaining battery containers 14, and can replenish each of the rest of the remaining battery containers 14 with a new battery module 18, as well as replacing the redistributed battery modules 18 of the given one of the battery containers 14 with new battery modules 18. Accordingly, the solution instructions 24 can be provided in a number of ways to allow implementation of the maintenance solution (e.g., by qualified technicians and/or machinery).

In addition, the solution instructions 24 can be provided along with an alarm, such as an audial or visual alarm to indicate that a maintenance solution is required and/or to indicate that the solution instructions 24 are available for providing maintenance to the battery power system 10. Furthermore, the solution instructions 24 can also account for spatial considerations in the addition of new or redistributed battery modules 18, such as based on limited space that may be associated with a given battery container 14. For example, the battery power system 10 can be initially constructed such that each of the battery containers 14 includes sufficient space for the inclusion of additional battery modules 18 (e.g., to accommodate the replenishment and/or redistribution solutions). However, in response to an indication that the energy capacity of a given one of the battery containers 14 is degraded, and in response to degradation controller 22 determining that the given one of the battery containers 14 does not include any additional space to accommodate another battery module 14, the degradation controller 22 can select the replacement solution instead of the replenishment and/or redistribution solutions. Thus, the degradation controller 22 can select a given maintenance solution based on such spatial considerations in addition to the monitored energy capacity.

Figure 2:
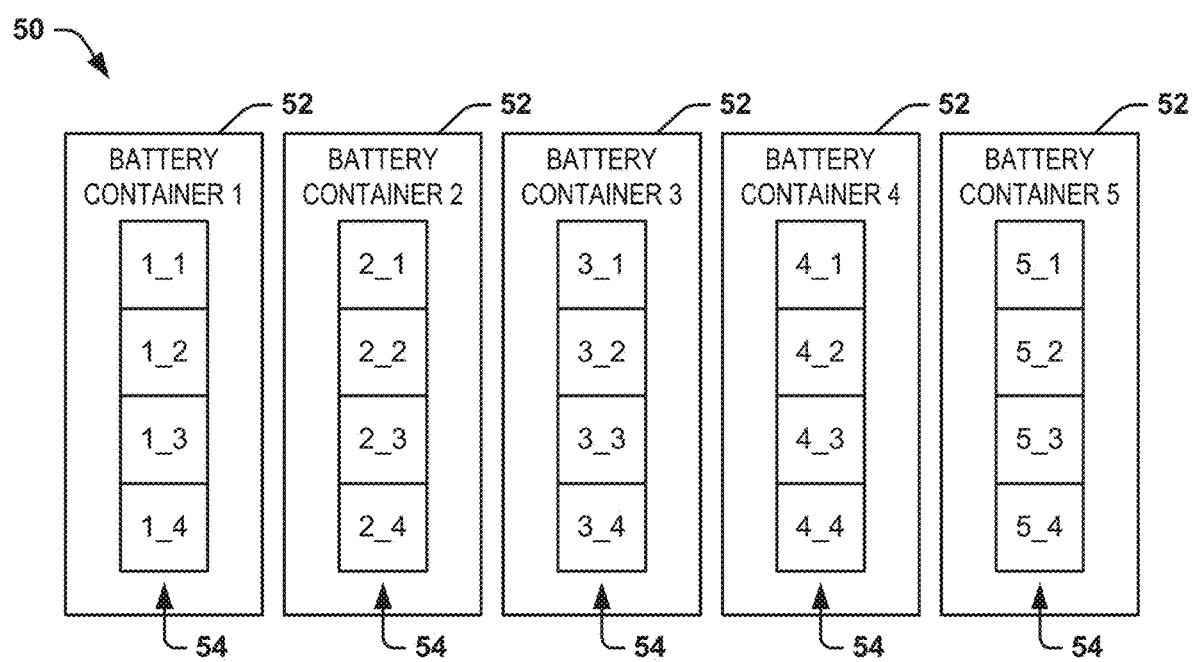
FIG. 2 illustrates an example diagram of a set of battery containers.

FIG. 2 illustrates an example diagram 50 of a set of battery containers 52. The battery containers 52 are demonstrated as five separate battery containers 52 that can each correspond to a respective one of the battery containers 14 in the example of FIG. 1. Therefore, the battery containers 52 each provide output power to the POI 12 via a respective inverter 16, as described previously. The battery containers 52 are each demonstrated as including four battery modules 54 that can likewise correspond to the battery modules 18 in the example of FIG. 1. The battery modules 54 are each labeled in an "X_Y" nomenclature, in which "X" corresponds to the number of the battery container 52 (e.g., "BATTERY CONTAINER X"), and in which "Y" corresponds to the number of the battery module 54 in the respective battery container 52. While the example of FIG. 2, and the following description of the examples of FIGS. 3-5, demonstrate five battery containers 52 with four (e.g., initial) battery modules 54 each, it is to be understood that the battery power system 10 can include any number of battery containers 52 and battery modules 54, and is not limited to the configuration demonstrated in the examples of FIGS. 2-5. The following description of the maintenance solutions in the examples of FIGS. 3-5 includes like reference numbers of the battery containers 52, the battery modules 54, and the labels of the battery modules 54 (such that redistributed battery modules 54 maintain the same respective label). Thus, reference is to be made to the example of FIG. 1 in the following description of the examples of FIGS. 2-5.

Figure 3:
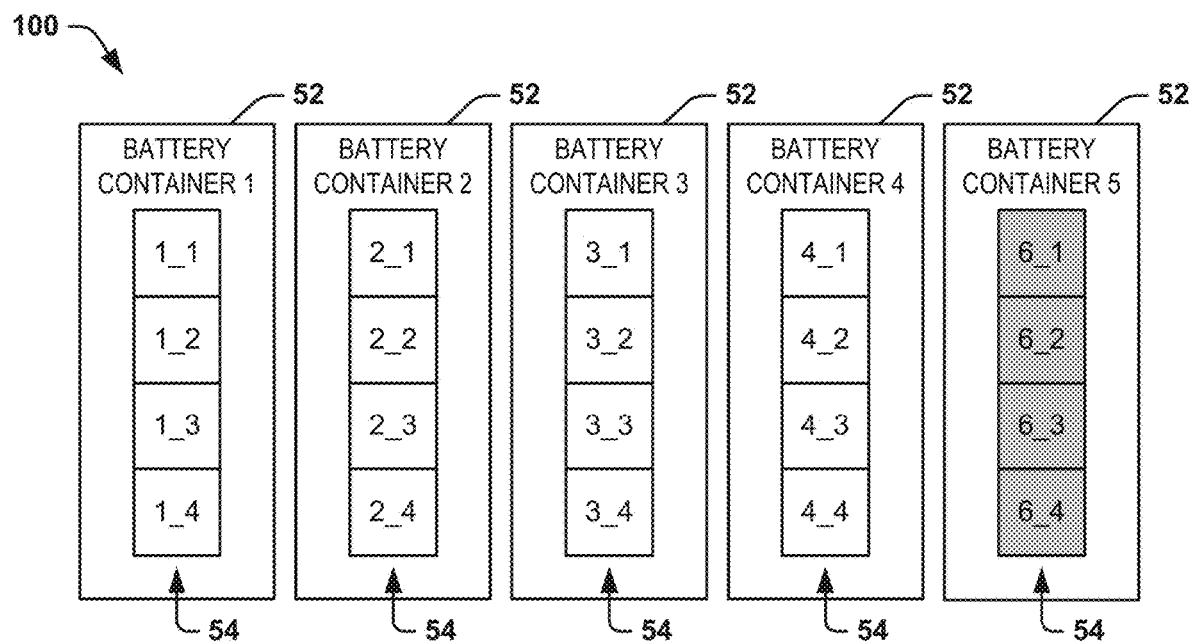
FIG. 3 illustrates a first example of battery power maintenance.

FIG. 3 illustrates a first example diagram 100 of battery power maintenance. The diagram 100 can correspond to the replacement solution, as described previously in the example of FIG. 1. For example, the replacement solution can be determined to be the appropriate maintenance solution by the degradation controller 22 in response to a determination that the energy capacity associated with a given one of the battery containers 52 is below the predetermined energy capacity threshold and that the energy capacity associated with the remaining battery containers 52 is above the predetermined energy capacity threshold of the respective remaining battery containers 52. In the example of FIG. 3, the degradation controller 22 can have determined that the energy capacity of the fifth battery container 52 (e.g., "BATTERY CONTAINER 5") is less than the predetermined energy capacity threshold (e.g., much less than the predetermined energy capacity threshold). As a result, the degradation controller 22 can generate the solution instructions 24 that are stored in the memory 26, or can access the predefined solution instructions 24 from the memory 26, in response to the determination of the replacement solution.

In the example of the diagram 100, the solution instructions 24 can provide instructions for replacing all of the battery modules 54 in BATTERY CONTAINER 5, and disposing of the previous (e.g., degraded) battery modules 54 of the given one of the battery containers 52. In the example of FIG. 3, the battery modules 54 labeled "5_1", "5_2", "5_3", and "5_4" are disposed of, and are replaced by new battery modules 54 labeled "6_1", "6_2", "6_3", and "6_4". In the example of FIG. 3, the new battery modules 54 are labeled "6_Y", despite being included in the fifth battery container 52, to differentiate the new battery modules 54 from the previous degraded battery modules 54 labeled "5_1", "5_2", "5_3", and "5_4" that are now disposed of.

Therefore, the new battery modules 54 labeled "6_1", "6_2", "6_3", and "6_4" provide sufficient power to return BATTERY CONTAINER 5 to greater than the predetermined energy capacity threshold.

Figure 4:
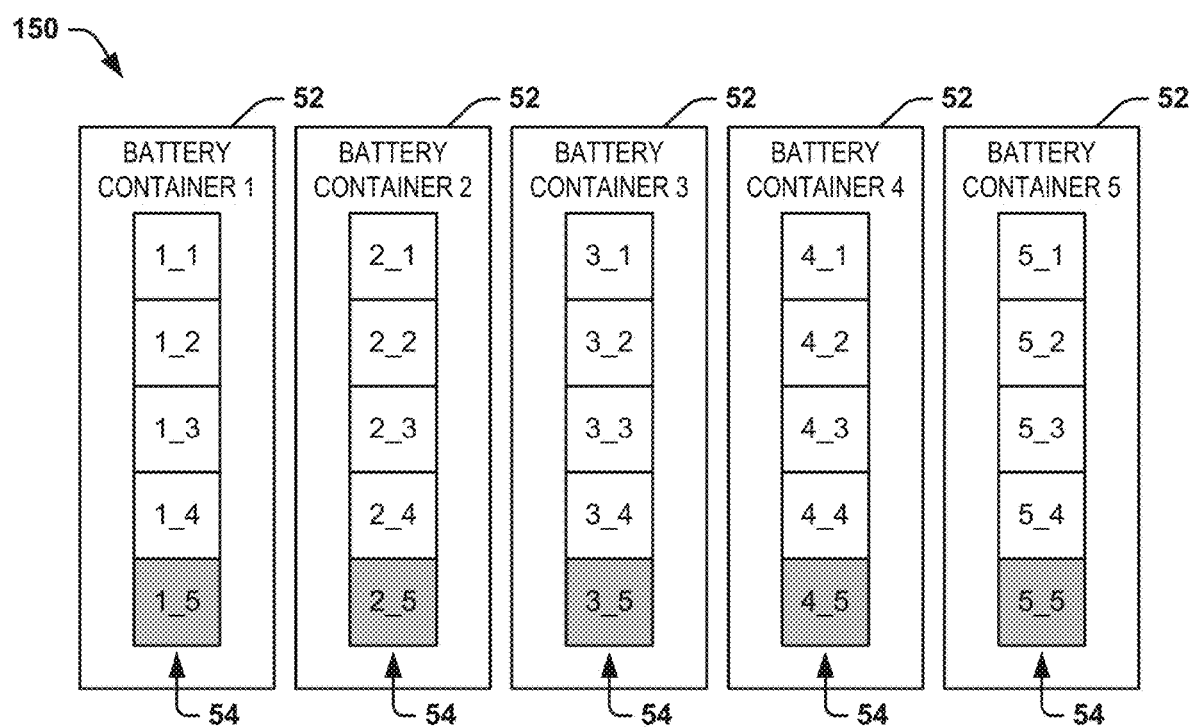
FIG. 4 illustrates a second example of battery power maintenance.

FIG. 4 illustrates a second example diagram 150 of battery power maintenance. The diagram 150 can correspond to the replenishment solution, as described previously in the example of FIG. 1. For example, the replenishment solution can be determined to be the appropriate maintenance solution by the degradation controller 22 in response to a determination that the energy capacity associated with at least one of the battery containers 52 is below the respective predetermined energy capacity threshold of each of the at least one battery containers 52. In the example of FIG. 4, the degradation controller 22 can have determined that all of the battery containers 52 have an energy capacity that is less than the predetermined energy capacity threshold. As a result, the degradation controller 22 can the generate solution instructions 24 that are stored in the memory 26, or can access the predefined solution instructions 24 from the memory 26, in response to the determination of the replenishment solution.

In the example of the diagram 150, the solution instructions 24 can provide instructions for adding a new battery module 54 to each of the battery containers 52 to increase the energy capacity of the respective battery container(s) 14. Thus, in the example of FIG. 4, a new battery module 54 labeled "1_5" is added to the other battery modules 54 in BATTERY CONTAINER 1. Similarly, a new battery module 54 labeled "2_5" is added to the other battery modules 54 in BATTERY CONTAINER 2, a new battery module 54 labeled "3_5" is added to the other battery modules 54 in BATTERY CONTAINER 3, a new battery module 54 labeled "4_5" is added to the other battery modules 54 in BATTERY CONTAINER 4, and a new battery module 54 labeled "5_5" is added to the other battery modules 54 in BATTERY CONTAINER 5. It is to be understood that the connection of the new battery modules 54 to the existing battery modules 54 of each of the battery containers 52 need not be at the end of the connected battery modules 54, but could instead be anywhere in the respective connections. As a result, the replenishment solution can maintain operation of degraded battery modules 54 in each of the first, second, third, and fourth battery containers 52 that may still have usable power-providing capability to maintain a more efficient solution than disposing of battery modules 54 that may still have useful power-providing capability. While the example of FIG. 4 demonstrates that all of the battery containers 52 receive a new battery module 54, it is to be understood that the replenishment maintenance solution can provide for replenishment of less than all of the battery containers 52 with a respective new battery module 54.

Figure 5:
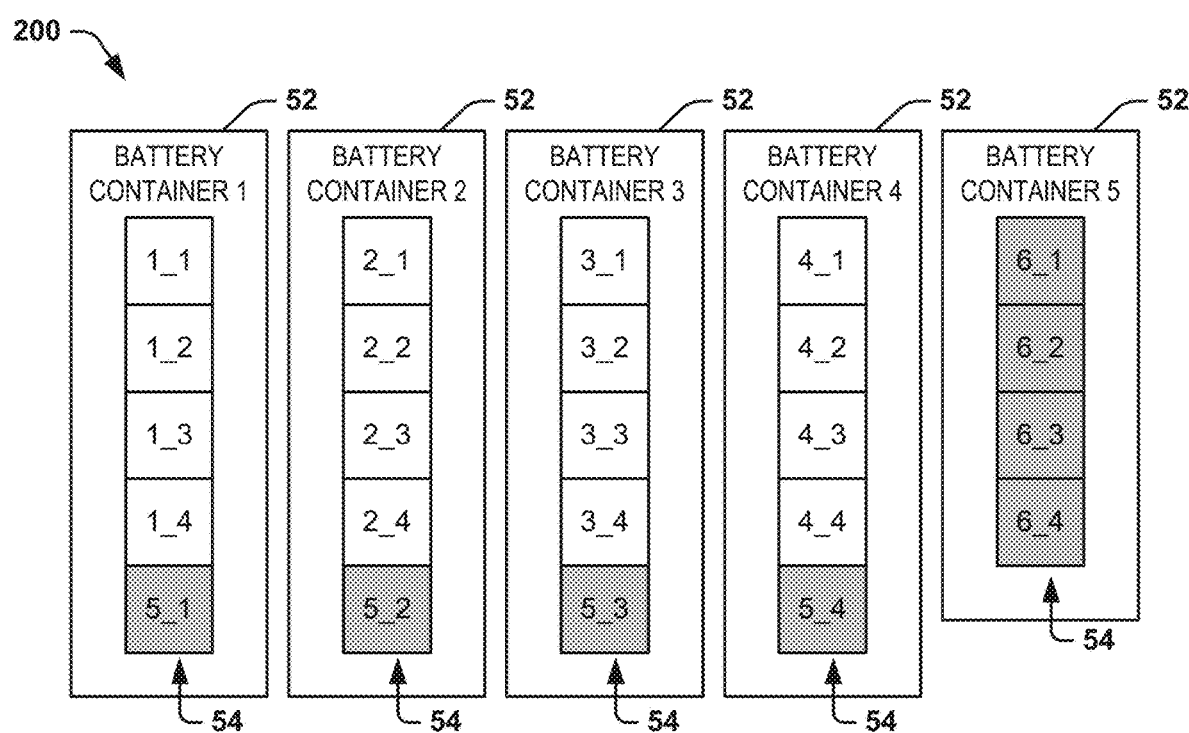
FIG. 5 illustrates a third example of battery power maintenance.

FIG. 5 illustrates a third example 200 of battery power maintenance. The diagram 200 can correspond to the redistribution solution, as described previously in the example of FIG. 1. For example, the redistribution solution can be determined to be the appropriate maintenance solution by the degradation controller 22 in response to a determination that the energy capacity associated with a given one of the battery containers 52 is above the predetermined energy capacity threshold and the energy capacity associated with one or more of the remaining battery containers 52 is below the predetermined energy capacity threshold. In the example of FIG. 5, the degradation controller 22 can have determined that the energy capacity of the fifth battery container 52 (e.g., BATTERY CONTAINER 5) is above the predetermined energy capacity threshold, and that the remaining battery containers 52 (BATTERY CONTAINER 1, BATTERY CONTAINER 2, BATTERY CONTAINER 3, and BATTERY CONTAINER 4) have an energy capacity that is less than the predetermined energy capacity threshold. As a result, the degradation controller 22 can the generate solution instructions 24 that are stored in the memory 26, or can access the predefined solution instructions 24 from the memory 26, in response to the determination of the redistribution solution.

In the example of the diagram 200, the solution instructions 24 can provide instructions for redistributing each of the battery modules 54 of BATTERY CONTAINER 5 labeled "5_1", "5_2", "5_3", and "5_4" to each of the respective other battery containers 52. In the example of FIG. 5, the battery module 54 labeled "5_1" is added to the other battery modules 54 in BATTERY CONTAINER 1, the battery module 54 labeled "5_2" is added to the other battery modules 54 in BATTERY CONTAINER 2, the battery module 54 labeled "5_3" is added to the other battery modules 54 in BATTERY CONTAINER 3, and the battery module 54 labeled "5_4" is added to the other battery modules 54 in BATTERY CONTAINER 4. In addition, the solution instructions 24 for the redistribution solution can also include adding new battery modules 54 to the given one of the battery containers 52, and thus replacing the redistributed battery modules 54. In the example of FIG. 5, new battery modules 54 labeled "6_1", "6_2", "6_3", and "6_4" are added to BATTERY CONTAINER 5 to replace the redistributed battery modules 54 labeled "5_1", "5_2", "5_3", and "5_4". Similar to as described previously, the new battery modules 54 are labeled "6_Y", despite being included in the fifth battery container 52, to differentiate the new battery modules 54 from the redistributed battery modules 54 labeled "5_1", "5_2", "5_3", and "5_4". Therefore, the redistributed battery modules 54 labeled "5_1", "5_2", "5_3", and "5_4" that may still have usable power output are added to the respective other battery containers 52, and the new battery modules 54 labeled "6_1", "6_2", "6_3", and "6_4" provide sufficient power to return BATTERY CONTAINER 5 to greater than the predetermined energy capacity threshold. Also, the state-of-health or energy capacity of all five BATTERY CONTAINERS of FIG. 5 may be substantially equal upon redistribution and replenishment, wherein the total energy capacity of the four new modules units in BATTERY CONTAINER 5 may be substantially equal to the total energy capacity of the five battery modules of similar states-of-health of any of BATTERY CONTAINERS 1-4.

Accordingly, the examples of FIGS. 2-5 demonstrate the separate respective maintenance solutions that can be implemented by the degradation controller 22 in response to the monitored energy capacity of the battery containers 52. Therefore, based on the determination of degradation of the battery modules 54 in the battery containers 52 based on the monitored battery energy capacity, the degradation controller 22 can determine a maintenance solution that can implement batteries of diminished, but not necessarily unusable, energy capacity. Accordingly, the maintenance solution can be more efficient than existing maintenance solutions that solely implement disposing of degraded battery modules.

In view of the foregoing structural and functional features described above, methods in accordance with various aspects of the present disclosure will be better appreciated with reference to FIG. 6. While, for purposes of simplicity of explanation, the method of FIG. 6 is shown and described as executing serially, it is to be understood and appreciated that the present disclosure is not limited by the illustrated orders, as some aspects could, in accordance with the present disclosure, occur in different orders and/or concurrently with other aspects from that shown and described herein. Moreover, not all illustrated features may be required to implement method in accordance with an aspect of the present disclosure.

FIG. 6 illustrates a method 250 for maintaining a battery power system (e.g., the battery power system 10). At 252, an energy capacity associated with each of a plurality of battery containers (e.g., the battery containers 14) is monitored. Each of the plurality of battery containers includes a plurality of battery modules (e.g., the battery modules 18) configured to provide an output power to a point-of-interconnect (e.g., the POI 12) associated with a power grid. The energy capacity can be monitored based on any of a variety of different ways to measure degradation, such as based on measuring an impedance associated with a respective plurality of battery modules. At 254, the energy capacity associated with each of a plurality of battery containers is compared to a predetermined energy capacity threshold to monitor a battery degradation of each of the plurality of battery containers. At 256, a maintenance solution comprising at least one option is selected from a list comprising a replacement solution (e.g., the diagram 100), a replenishment solution (e.g., the diagram 150), and a redistribution solution (e.g., the diagram 200) in response to determining that the energy capacity is less than the predetermined energy capacity threshold. At 258, solution instructions (e.g., the solution instructions 24) for implementing the selected maintenance solution are provided.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method for maintaining a battery power system comprising a plurality of battery containers, each battery container comprising a plurality of battery modules, and the plurality of battery containers provide an output power to a point-of-interconnect associated with a power grid, the method comprising redistributing the plurality of battery modules associated with a given one of the plurality of battery containers to respective remaining battery containers of the plurality of battery containers, wherein the plurality of battery modules associated with the given one of the plurality of the battery containers have an equal state of health prior to the redistributing.

2. The method of claim 1, wherein after redistribution, each of a portion of the plurality of battery containers comprises a plurality of original battery modules and one of the plurality of battery modules associated with the given one of the plurality of battery containers, such that the given one of the plurality of battery containers comprises battery modules of a corresponding state-of-health to the plurality of original battery modules of each of the portion of the plurality of battery containers.

3. The method of claim 2, further comprising adding at least one new battery module to the given one of the plurality of battery containers in response to redistributing the plurality of battery modules associated with a given one of the plurality of battery containers to the respective remaining battery containers of the plurality of battery containers, wherein an energy capacity of the given one of the plurality of battery containers having the at least one new battery module is equal to an energy capacity of the respective remaining plurality of battery containers comprising the redistributed plurality of battery modules.

4. A method for maintaining a battery power system comprising a plurality of battery containers, each battery container comprising a plurality of battery modules, wherein the plurality of battery containers provide an output power to a point-of-interconnect associated with a power grid, the method comprising redistributing the plurality of battery modules associated with a given one of the plurality of battery containers to respective remaining battery containers of the plurality of battery containers, wherein after redistribution, each of a portion of the plurality of battery containers comprises a plurality of original battery modules and one of the plurality of battery modules associated with the given one of the plurality of battery containers, wherein each of the plurality of battery modules of a respective one of at least one of the battery containers have an equal state of health prior to the redistributing.

5. The method of claim 4 further comprising adding at least one new battery module to the given one of the plurality of battery containers in response to redistributing the plurality of battery modules associated with the given one of the plurality of battery containers to the respective remaining battery containers of the plurality of battery containers.

6. The method of claim 5, wherein an energy capacity of the given one of the plurality of battery containers comprising the at least one new battery module is equal to an energy capacity of the respective remaining plurality of battery containers comprising the redistributed plurality of battery modules.

* * * * *